(12) United States Patent
Bryant et al.

(10) Patent No.: US 6,192,599 B1
(45) Date of Patent: Feb. 27, 2001

(54) DRYING PROCESS FOR WOVEN FABRIC INTENDED FOR USE AS A REINFORCING LAMINATE IN PRINTED CIRCUIT BOARDS

(75) Inventors: Michael I. Bryant, Thomasville, NC (US); Charles E. Jones, Hurt, VA (US)

(73) Assignee: BGF Industries, Inc., Greensboro, NC (US)

( * ) Notice: Subject to any disclaimer, the term of this patent is extended or adjusted under 35 U.S.C. 154(b) by 0 days.

(21) Appl. No.: 09/159,415

(22) Filed: Sep. 23, 1998

(51) Int. Cl.[7] .................................................. F26B 3/34
(52) U.S. Cl. ................................................ 34/255; 34/400
(58) Field of Search ............................... 34/246, 255, 256, 34/257, 258, 380, 381, 308, 398, 399, 400; 219/701, 705; 156/275.3, 379.6, 379.8, 555; 427/543, 388.1, 391, 393

(56) References Cited

U.S. PATENT DOCUMENTS

| | | | |
|---|---|---|---|
| 2,511,839 | * 6/1950 | Frye | 34/255 |
| 3,011,265 | * 12/1961 | Bateson | 34/255 |
| 3,267,584 | * 8/1966 | Southwell | 34/255 |
| 3,629,948 | 12/1971 | Hilton et al. | 34/1 |
| 4,414,264 | 11/1983 | Olson | 428/241 |
| 4,563,385 | 1/1986 | Bhatt et al. | 428/251 |
| 4,579,772 | 4/1986 | Bhatt et al. | 428/229 |
| 5,206,078 | 4/1993 | Inoguchi et al. | 428/225 |
| 5,263,263 | * 11/1993 | Gheorghiu et al. | 34/257 |
| 5,273,816 | 12/1993 | Olson et al. | 428/272 |
| 5,388,345 | * 2/1995 | Brundage et al. | 34/256 |
| 5,406,058 | * 4/1995 | Lipp | 34/255 |
| 5,659,972 | 8/1997 | Min et al. | 34/255 |
| 5,977,532 | * 11/1999 | Ekemar | 34/255 X |
| 5,981,022 | * 11/1999 | Min et al. | 34/255 X |

OTHER PUBLICATIONS

Macrowave Trademark, 980 Series, Specifiation (2 pages); Publication date unknown, believed to be prior art, but no admission in this respect.

* cited by examiner

*Primary Examiner*—Stephen Gravini
(74) *Attorney, Agent, or Firm*—Rhodes & Mason P.L.L.C.

(57) ABSTRACT

A process for the drying of woven glass fabric to be used in a reinforcing laminate in sensitive electronic equipment is disclosed. The process adopts a drying technique of utilizing dielectric or radio frequency heating which results in a cleaner product.

6 Claims, 1 Drawing Sheet

DRYING PROCESS FOR WOVEN FABRIC INTENDED FOR USE AS A REINFORCING LAMINATE IN PRINTED CIRCUIT BOARDS

FIELD OF THE INVENTION

The present invention generally relates to the production of woven glass fabrics and particularly to the drying of woven glass fabrics for use as a substrate for printed circuit boards.

BACKGROUND

Laminated circuit boards are used widely in sensitive electronic equipment such as computers and communications equipment. Circuit boards, generally, are multi-layer composites of thermosetting polymers and suitable reinforcing materials. One suitable reinforcing material is woven glass fabric.

Such reinforcing fabrics are extremely fine, light weight and very fragile. During processing, the fabric is particularly susceptible to the presence of any residue or particulate matter that, if conductive, may cause performance malfunctions (such as short circuits) in the finished printed circuit boards. Due to such sensitivity, high standards of cleanliness and quality are imposed. Fabrics commonly are rejected if the fabrics are contaminated with any foreign particles, whether conductive or not.

Heretofore, such fabrics have been dried using hot air, contact heat, or infrared radiation. Such drying techniques are acceptable for ordinary applications in which deposits of some foreign particulate matter will not adversely affect the product or may be washed out after subsequent operations. However, these techniques have proved to be a problem where the fabric is used in the manufacture of printed circuit boards. Hot air, contact heat, and/or infrared radiation techniques are prone to leave fine particles that may contaminate the woven glass fabric. Hot air introduces a foreign fluid stream that is riddled with particulate matter. Contact heat can cause migration from one face of the fabric to another and results in uneven and non-uniform drying. Infrared radiation cannot be controlled sufficiently; therefore a mechanical shutter system must be used to prevent excessive heating of the fabric. The shutter system introduces rust, dirt, and other particulate matter to the fabric environment. Further, fiberglass fabrics are fragile and are often damaged during these harsh drying processes.

There exists a need for a more uniform and controlled drying process that achieves the necessary cleanliness and sensitivity required for fabrics to be used in laminates for electronics.

SUMMARY OF THE INVENTION

The present invention is a process for the manufacture of woven glass fabric to be used in sensitive electronic equipment. The process adopts a drying technique utilizing dielectric or radio frequency heating.

Radio frequency drying involves the heating of electrically nonconducting materials by a rapidly varying electromagnetic field. While radio frequency drying (RF drying) has been used to dry fabrics, the technique generally has been used in shrinkage control systems.

With respect to cleaner drying systems for sensitive fabrics such as fiberglass fabrics for printed circuit board laminates, however, the use of radio frequency energy is unknown. Generally, RF drying processes are not as cost-effective as other drying processes such as hot air, contact heat or infrared radiation. However, RF drying is substantially cleaner and produces a higher quality substrate fabric for electronic equipment. With RF drying there is no pollution from gas or oil fired burners or electric heating elements. The reduced air volume that is required with RF drying reduces air-based contaminants. Further, the RF oven itself is constructed of aluminum thereby eliminating the rust particles present in conventional dryer baffles and ductwork.

It is an object of the present invention to produce a cleaner woven glass fabric well suited to use as a reinforcing laminate for electronic applications. An added feature of drying glass fabrics by RF is the increased control over the drying process. The use of a controllable RF dryer eliminates the need for accumulators in the process. Accumulators are used in conventional fabric drying operations to facilitate continuous running and avoid stopping the dryer. Neither entrance nor exit accumulators are necessary with RF dryers. Accumulators are a chronic source of fabric distortion due to alignment difficulties. It is easier to handle fragile, lightweight fabrics when the accumulators are removed from the process. Moreover, the associated problems of accumulators, such as alignment, are eliminated. The RF dryer can be quickly stopped without accumulators to avoid damage to the glass woven fabric.

DETAILED DESCRIPTION OF THE PREFERRED EMBODIMENT

Figure 1:
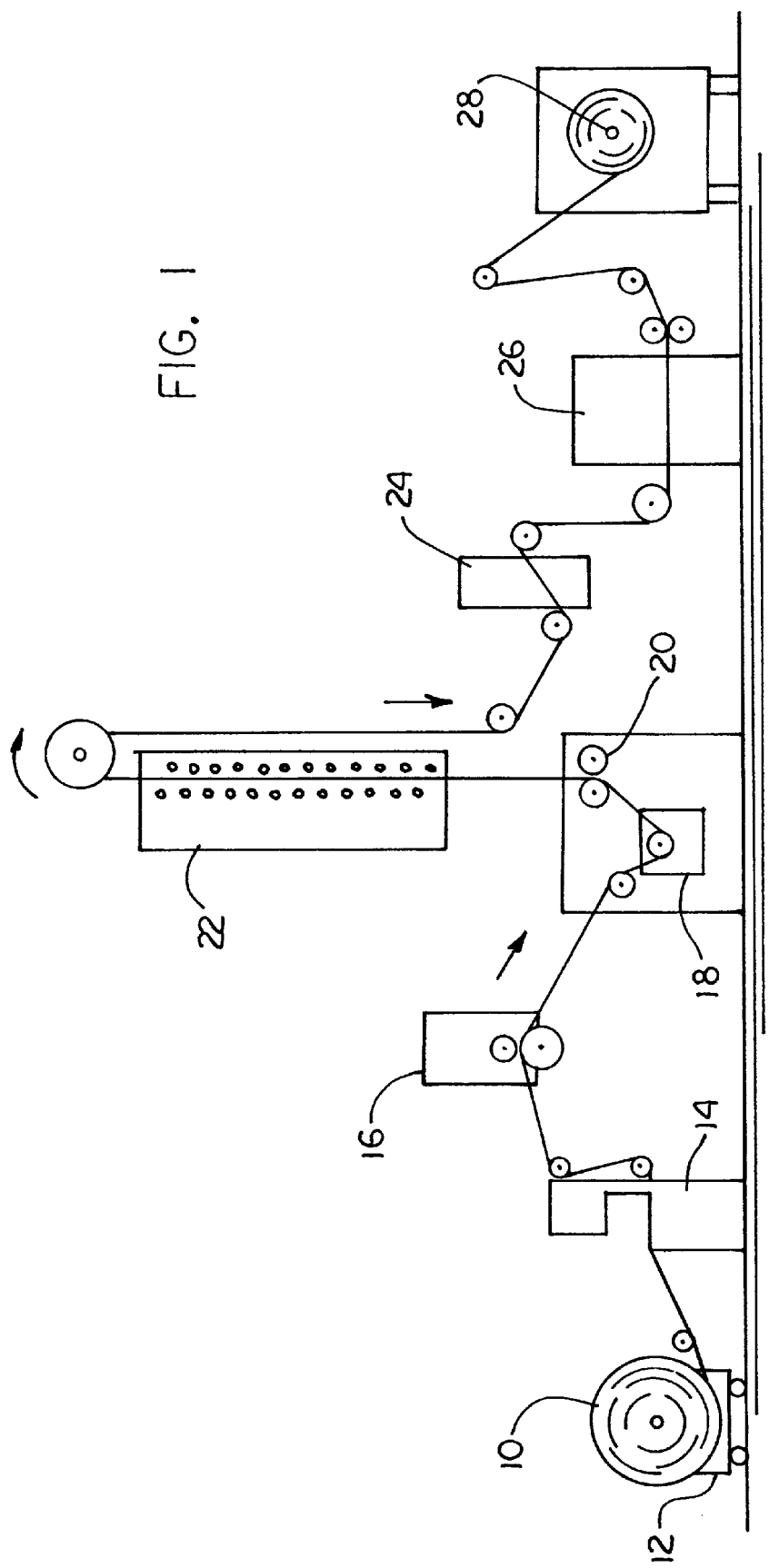
FIG. 1 is a schematic representation of the method of the present invention.

FIG. 1 represents a schematic drawing of the method of the present invention. All equipment is preferably enclosed within a Plexiglas® or other suitable enclosure with a positive air pressure filtered atmosphere maintained.

Woven glass fabric 10 is supported on a mandrel 12. The fabric 10 preferably is initially placed in a batch oven (not shown) for heat cleaning. The fabric 10 is seamed by a thermal splicer 14. A draw roll assembly 16 pulls the fabric 10 and controls the tension in the unit. Thereafter, the fabric 10 is immersed in an application pad box 18 where it is completely saturated in an aqueous based finish solution. Although different types of finish solution may be used, preferably the finish solution is a silane coupling agent of less than 1% concentration. The fabric 10 is then subjected to squeeze rolls 20 to remove the excess finish solution. The wet fabric 10, which is approximately about 40% wet pick up, is subjected to dielectric heating in an RF dryer 22 where it is "completely dried." The term "completely dried" as used herein means fabrics having less than 0.2% moisture content. Depending on the fabric style, the wet pick up may be between about 20% to 50%.

During the drying process the fabric is preferably substantially vertical because of the close clearance between the electrodes. Thus, if tension is lost in the fabric as it travels vertically, the fabric will not sag onto the electrodes.

The dielectric heater preferably is a RFC Macrowave™ Model 952 vertical single pass web dryer distributed by Radio Frequency Co., of Millis, Mass. Although other dryers and frequencies may be used, the RFC Macrowave™ Model 952 system includes a generator with a nominal operating frequency of about 40.68 MHz with a tolerance of ±0.05%. The generator requires 460 V, 3 Ω, 60 Hz, and 90 kVA input at full output power. The watercooler oscillator tube with a capacity of 180,000 Btu is rated for 120 kW maximum power. Further, the generator operates with self-contained dust-tight cool air circulation to maintain component ratings and reliability. The system also includes a vertical single pass staggered through-field applicator for the generator. The drying zone is configured to accept a 63" (1600 mm) wide web with a ±1" tracking wander.

After drying, the fabric 10 is subjected to a vacuum unit 24 that removes remaining lint and fibers from the dried fabric 10. Preferably, an inspection is completed on-line with automatic inspection equipment 26. The clean, dried fabric 10 is then taken up in a finished roll 28.

The term clean is used to define fabric that has undergone the lamination process and passes magnified optical inspection. For example, the fabric is subjected to an epoxy resin and copper clad. Thereafter, a circuit pattern is etched onto the laminate. The board is then optically inspected under magnification. If particulate matter is detected the laminate is marked. A clean laminate, therefore, is one substantially free of particulate matter.

To test the RF system, a web drying system was used with a 1 ¼ inch staggered through-filed electrode system. Samples of product were secured to a paddle and oscillated while the RF is applied for the required dwell time. A rail system supports the paddle. The following table represents arbitrary production specifications chosen to simulate the RF drying procedure.

TABLE 1

| | |
|---|---|
| A. Production speed | 45 yds./min. = 135 fpm = 2.25 ft./sec. |
| B. Array length | 8 ft. |
| C. Dwell time (B/A) | 8 ft./2.25 ft./sec = 3.55 sec. |
| D. Array length in test unit | 6 ft. |
| E. Speed required for stimulation (D/C) | 6 ft./3.55 sec. = 17.0 ft./sec. = 101 ft./min. |

To calculate moisture loss, the samples were weighed before drying, after drying, and also after left in a kiln for ten minutes. The kiln drying allows for the measurement and determination of the bone-dry weight. The plate current was recorded before and during testing. Table 2 shows the results of 5 samples of RF-dried fiberglass mat. The effective dwell time, as shown above in Table 2, is dependent upon the desired production speed and the array length. Moreover, the speed required for stimulation is dependent upon the dwell time and the array length in the test unit. All samples showed acceptable levels of non-contamination.

TABLE 2

| | TEST 1 | TEST 2 | TEST 3 | TEST 4 | TEST 5 |
|---|---|---|---|---|---|
| Initial Weight | 6.24 g | 6.48 g | 6.09 g | 6.16 g | 7.55 g |
| Moisture Content[†] | 16% | 18.5% | 16% | 16.8% | 43.8% |
| Final Weight | 5.38 g | 5.49 g | 5.26 g | 5.29 g | 5.26 g |
| Moisture Content[†] | 0% | 0.18% | 0.19% | 0% | 0.19% |
| Bone-dry weight | 5.38 g | 5.48 g | 5.25 g | 5.29 g | 5.25 g |
| Idle Current | 1.0 Å | 1.2 Å | 1.2 Å | 1.2 Å | 1.2 Å |
| Plate Current During Test | 1.1 Å | 1.3 Å | 1.25 Å | 1.25 Å | 1.4 Å |

[†] All moisture contents are based on bone-dry weights.

To determine the level of foreign particles on woven glass fabrics dried with hot air, 10 samples were tested using a Teknek DCR12 Dust Cleaning Roller and Teknek DCR Pads. The DCR Roller was cleaned by rolling over the DCR Pad before each use. The cleaned DCR Roller was held against moving woven glass fabric either on a take-up roll or opposite a steel roller on a finishing unit or inspection frame. The DCR Roller ran in contact with the fabric for approximately 30 linear feet, calculated by a timed interval (seconds required=600/yards per minute). Immediately thereafter, a new DCR Pad was uncovered and the DCR Roller was rolled over the new Pad. The Pad was then covered with a sheet of overhead transparency film.

Using a 5" diameter fluorescent magnifier work lamp at a distance of approximately 12" to 14" the DCR Pad was inspected with all visible particles being circled. The number of circles were counted and recorded as particles per 30 sq. ft. of glass fabric surface. Using hot air as the method for drying the fabric, levels from 25 to 84 particles per 30 sq. ft. remained on the fabric. This level of particulate matter is unacceptable for sensitive electronic equipment laminates. We estimate that RF Drying will result in at least a 70% reduction in foreign particles as compared to previous methods of drying, such as hot air.

The foregoing has described a substrate material and its method of manufacture by which the quality of woven glass fabric and, thus, the quality of circuit boards themselves can be significantly improved. Drying the woven glass substrate fabric by dielectric heating results in a significantly cleaner fabric.

While the invention has been particularly shown and described with reference to a preferred embodiment thereof, it will be understood by those skilled in the art that various changes in form and details may be made therein without departing from the spirit and scope of the invention.

We claim:

1. A method comprising:

drying woven glass fabric suitably for use in a laminated substrate for electronics by subjecting the woven glass fabric to a radio frequency electric field, whereby the resulting woven glass fabric is sufficiently clean and free from particulate matter so as to be effective for use iii a laminated substrate for printed circuit boards.

2. The method of claim 1 wherein the frequency is about 40.68 MHz.

3. The method of claim 2 wherein the frequency tolerance is ±0.05%.

4. The method of claim 1 wherein the fabric is subjected to radio frequency for an effective dwell time based on a production speed and an array length of the fabric.

5. The method of claim 4 wherein the fabric achieves a final moisture content of less than 0.2% by weight after drying.

6. A method for drying and finishing woven glass fabric intended for use as a reinforcing laminate in printed circuit boards comprising the steps of:

a) immersing the fabric in an aqueous-based finishing solution having a silane coupling agent of less than 1% concentration;

b) passing the fabric through squeeze rolls to attain a moisture content of approximately between 20% and 50% wet pick up; and c) subjecting the fabric to a radio frequency electric field until the moisture content is reduced to no greater than 0.2%.

* * * * *